United States Patent [19]

Hayashikoshi et al.

[11] Patent Number: 5,132,928

[45] Date of Patent: Jul. 21, 1992

[54] DIVIDED WORD LINE TYPE NON-VOLATILE SEMICONDUCTOR MEMORY DEVICE

[75] Inventors: Masanori Hayashikoshi; Yasushi Terada; Kazuo Kobayashi; Takeshi Nakayama; Yoshikazu Miyawaki, all of Hyogo, Japan

[73] Assignee: Mitsubishi Denki Kabushiki Kaisha, Tokyo, Japan

[21] Appl. No.: 501,703

[22] Filed: Mar. 30, 1990

[30] Foreign Application Priority Data

Jun. 1, 1989 [JP] Japan .................. 1-141529

[51] Int. Cl.⁵ .................... G11C 7/00; G11C 8/00
[52] U.S. Cl. .................. 365/63; 365/230.03; 365/189.01
[58] Field of Search .......... 365/51, 230.06, 230.03, 365/185, 63, 226; 371/21

[56] References Cited

U.S. PATENT DOCUMENTS

| Re. 32,993 | 7/1989 | Anami et al. | |
| Re. 33,280 | 7/1990 | Yoshimoto et al. | |
| 4,542,486 | 9/1985 | Anami et al. | 365/230.03 |
| 4,554,646 | 11/1985 | Yoshimoto et al. | 365/230.03 |
| 4,555,778 | 11/1985 | Sakurai | 365/230.03 X |
| 4,590,588 | 5/1986 | Itoh et al. | 365/230.03 X |
| 4,694,428 | 9/1987 | Matsumura et al. | 365/63 X |
| 4,783,767 | 11/1988 | Hamada | 365/230.03 X |
| 4,827,449 | 5/1989 | Inoue | 365/63 |
| 4,878,203 | 10/1989 | Arakawa | 365/230.03 X |

OTHER PUBLICATIONS

"A 64Kb CMOW EEROM with On-Chip ECC" by S. Mehrotra et al. in IEEE International Solid-State Circuit Conference 1984, Digest of Technical Papers, pp. 142-143.

Primary Examiner—Alyssa H. Bowler
Attorney, Agent, or Firm—Lowe, Price, LeBlanc and Becker

[57] ABSTRACT

An electrically programmable non-volatile semiconductor memory device includes a plurality of internal data transmission lines. Data communication between memory cells and the internal data transmission lines is performed for a byte of data having a plurality of bits. Each of the word lines includes a plurality of divided auxiliary word lines in association with the internal data transmission lines. Those memory cells for each word line that are to be connected to the same internal data transmission line are connected to one auxiliary word line. Only one of a plurality of memory cells connected to one auxiliary word line is connected to an internal data transmission line in operation. Therefore, a plurality of the memory cells connected to different auxiliary word lines, are connected in parallel to a plurality of the internal data transmission lines. According to this arrangement, the effect of word line destruction occasionally caused in one auxiliary word line is not extended to other auxiliary word lines, so that the damaged auxiliary word line can be repaired by the use of an error correction detection code.

22 Claims, 9 Drawing Sheets

DIVIDED WORD LINE TYPE NON-VOLATILE SEMICONDUCTOR MEMORY DEVICE

BACKGROUND OF THE INVENTION

1. Field of the Invention

This invention relates to a non-volatile semiconductor memory device and, more particularly, to an electrically erasable semiconductor memory device. More specifically, it relates to a batch erasing type flash EEPROM, that is, an electrically erasable read only memory.

2. Description of the Background Art

FIG. 1 shows an example of the overall structure of a conventional non-volatile semiconductor memory device. Referring to this figure, the non-volatile semiconductor memory device includes a memory cell array 1 comprised of a plurality of memory cells for non-volatile data storage. As will become apparent hereinafter, the memory cell array 1 is comprised of a plurality of word lines arranged in a row direction, a plurality of bit lines in a column direction and memory cells each provided at each intersection point between a word line and a bit line.

An X address buffer 2 and an X decoder 3 are provided for selecting a row of the memory cell array 1. The X address buffer 2 is supplied with an X address from an exterior of the device to produce an internal row address. The X decoder 3 decodes the internal row address from the X address buffer 2 to select an associated row in the memory cell array 1 to transmit an activating signal on the selected word line.

A Y address buffer 4 and a Y decoder 5 are provided for selecting columns of the memory cell array 1. The Y address buffer 4 is supplied with a Y address from the exterior to produce an internal column address. The Y decoder 5 decodes the internal column address from the Y address buffer 4 to produce a signal for selecting associated columns.

A column select gate 6, a write driver 7, a sense amplifier 8, an ECC (error checking and correction) circuit 9, an input buffer 10 and an output buffer 11 are provided to effect data exchange between the memory cell array 1 and a device or devices outside the memory device. A column select gate 6 is responsive to the column select signal from the Y decoder 5 to connect associated columns of the memory cell array 1 to the write driver 7 and the sense amplifier 8 via I/O lines, that is inner data transmission lines. The write driver 7 transmits the data supplied thereto in data writing to the selected memory cells via column select gate 6. The sense amplifier 8 is activated in data reading to amplify and output data supplied thereto via column select gate 6. The ECC circuit 9 takes charge of detection and correction of data errors. The ECC circuit 9 produces parity bits for data error detection/correction in accordance with, for example, the Hamming Coding Method, for write data Din supplied thereto via input buffer 10 to transmit the produced parity bits to the write driver 7 in parallel with the write data Din. In data reading out, the ECC circuit 9 similarly produces check bits for the data supplied thereto via sense amplifier 8 to effect comparison between the read-out parity bits and the produced check bits to detect and correct data errors based on the results of comparison to supply the corrected data to the output buffer 11. The data supplied to the input buffer 10 and the output buffer 11 are subjected to waveform shaping before being outputted from these buffers 10, 11.

An electrically erasable ROM (EEROM), having the function of error detection/correction as shown in FIG. 1 is shown by S. Mehrotra et al. in IEEE, International Solid-State Circuit Conference 1984, Digest of Technical Papers, pages 142 to 143.

For defining various operational timings in the above described semiconductor memory device, there is provided a control signal generator 12 which is responsive to write enable signals $\overline{WE}$, output enable signal $\overline{OE}$ and chip enable signals CE or chip select signal CS supplied thereto from an exterior of the device to produce various timing control signals. In FIG. 1, a semiconductor chip is indicated by a broken-line block 100.

FIG. 2 shows the structure of a major part of the semiconductor memory device shown in FIG. 1. Although one byte usually means 8 bits, it is assumed that, in the construction illustrated in FIG. 2, each byte is constituted by 2 bit memory cells for purpose of clarity of the disclosure. Each memory cell is constituted by a selection transistor Qi, i being 1 to 8, and a memory transistor Mi, i being 1 to 8. The selection transistor Qi has its drain connected to a bit line BLi, its gate to the word line WL, and its source to the drain of the associated memory transistor Mi. The memory transistor Mi is constituted by a floating gate type insulated gate field effect transistor. The memory transistor Mi has its control gate connected to a control gate line CGL, via an insulated gate type field effect transistor or MOS transistor Q9, while having its source connected to a ground potential via MOS transistor Q10. The transistor Q10 is rendered conductive in erasure and reading-out modes to ground the source line while it is rendered non-conductive to bring the source line into an electrically floating state in a programming mode.

The MOS transistor Q9 has its gate connected to the word line WL. A source line select signal SL is applied to the gate of the MOS transistor Q10.

The bit lines BL1 to BL8 are connected to data input/output lines I/O1 and I/O2 via MOS transistors Q11 to Q18 functioning as column select gates. Thus the bit line BL1 is connected to the input/output line I/O1 via MOS transistor Q11, while the bit line BL2 is connected to the input/output line I/O2 via MOS transistor Q12. The bit line BL3 is connected to the input/output line I/O1 via MOS transistor Q13, while the bit line BL4 is connected to the input/output line I/O2 via MOS transistor Q14. The bit lines BL5 and BL6 are connected to the input/output lines I/O1 and I/O2 via MOS transistors Q15 and Q16, respectively. The bit line BL7 and BL8 are connected to the input/output lines I/O1 and I/O2 via MOS transistors Q17 and Q18, respectively.

A Y gate signal, that is, a column select signal Y1 is applied from the Y decoder 5 to the gates of the MOS transistors Q11 and Q12. A Y gate signal Y2 is applied from the Y decoder 5 to the gates of the MOS transistors Q13 and Q14. A Y gate signal Y3 is applied from the Y decoder 5 to the gates of the MOS transistors Q15 and Q16. A Y gate signal Y4 is applied to the gates of the MOS transistors Q17 and Q18 from the Y decoder 5. The above described arrangement allows performing data writing/reading into and out of 1-byte memory cells at a time.

The row select signal from the X decoder 3 is applied via MOS transistor Q19 to the word line WL for row selection. A Vpp switch 20, adapted for further raising the potential of a word line WL which is in the selected state during data writing, is connected to the word line WL. A predetermined potential, such as the source (power supply) potential Vcc, is applied to the gate of the MOS transistor Q19, which thus has the function of preventing the high voltage generated during the operation of the Vpp switch 20 from affecting an output circuit portion of the X decoder 3.

The X decoder 3 has, for each word line, a NAND gate 31 and an inverter 32 adapted for receiving an output of the NAND gate 31. The row select signal is generated by the inverter 32.

The cross-section of a memory cell is shown diagrammatically in FIG. 3. Referring to this figure, the memory transistor includes an N+ impurity region 201 acting as a source, an N+ impurity region 202 acting as a drain and, a floating gate 203 and a control gate 204. An interlayer insulating film 208 is formed between the floating gate 203 and the control gate 204. A gate insulating film 207 is formed between the floating gate 203 and a semiconductor substrate 200. A tunnel insulating film 209 of a reduced film thickness is formed between the floating gate 203 and the drain region 202. Exchange of electrons between the floating gate 203 and the drain region 202 occurs by way of this tunnel insulating film 209.

A selection transistor includes an N+ impurity region 202 acting as a source, an N+ impurity region 205 acting as a drain and a gate electrode 206. A gate insulating film 210 is formed between the gate electrode 206 and the semiconductor substrate 200. The N+ impurity region 205 is connected to the bit line BL.

In the above described memory cell structure, data storage is performed depending on the amount of the electrical charges stored in the floating gate 203. That is, when a high electrical voltage Vpp is applied to the control gate 204, and the N+ impurity region is at the ground potential, the electrons are injected, by the resultant high electrical field, via the tunnel insulating film 209 into the floating gate 203. This causes the threshold voltage of the memory transistor to be shifted in the positive direction. Conversely, when the N+ impurity region 202 is at the high voltage Vpp and the control gate 204 is at the ground potential level, the electrical charges are extracted from the floating gate 203 into the N+ impurity region 202. This causes the threshold voltage of the memory transistor to be shifted in the negative direction.

During data read-out, a predetermined read-out voltage is applied to the control gate 204. During selection, a logical high or "H" level potential is applied to the gate of the selection transistor 206. The memory transistor is turned on or off depending on the amount of the electrical charges stored in the floating gate 203. With the selection transistor in the turned-on state, a current flow is or is not caused through the bit line BL when the memory transistor is in the turn-on or in the turn-off state, respectively. The current flow on the bit line BL is sensed by the sense amplifier so as to be converted into a voltage signal to permit read-out of the "1" or "0" data.

The Vpp switch 20 shown in FIG. 2 has a construction as shown in FIG. 4. Referring to FIG. 4, the Vpp switch 20 includes MOS transistors Q101, Q102 and a capacitor C1. The MOS transistor Q101 has its drain connected to the high voltage Vpp and its gate connected to the source of the transistor Q102 and to the word line WL, while having its source connected to the drain and the gate of the MOS transistor Q102 and to one electrode of the capacitor C1. The other electrode of the capacitor C1 is fed with control clock signals CLK. This Vpp switch 20 operates such that, when the potential on the word line WL is at the "H" level, and hence the MOS transistor Q101 is in the turn-on state, the potential corresponding to the potential on the word line WL is applied to one electrode of the capacitor C1 and to the drain and the gate of the transistor Q102. When the control clock signals CLK are supplied to the Vpp switch 20 in the form of a repetition of pulses, the potential at the one electrode of the capacitor C1 is gradually raised by its bootstrap function for each clock pulse. The thus raised voltage is transmitted to the word line WL via a MOS transistor Q102. The increased potential is applied to the gate of the MOS transistor Q101 to raise the potential at the node ND through the transistor Q101 by the supply of a voltage from the Vpp generator. By the repetition of the above operation, the potential on the word line WL ultimately reaches the high voltage Vpp level.

With the potential on the word line at the "L" level, the transistor Q101 is in the turn-off state and no voltage is supplied to the one electrode of the capacitor C1, so that transistor Q102 is not turned on, and the potential on the word line WL remains at the logical low or "L" level.

The operation of the non-volatile semiconductor memory device shown in FIG. 2 will be explained with referring to FIGS. 3 and 4. Although the semiconductor memory device of FIG. 2 may be operated in both flash erasure and page erasure modes, the following description will be made of the page erasure mode type operation.

The operation in the semiconductor memory device includes data writing and data reading. The page writing operation is first explained. The data writing operation includes external writing operation and internal writing operation. In the external writing operation, memory cells are selected responsive to the X and Y addresses supplied externally. More specifically, a corresponding word line WL is selected by the X decoder 3. The potential on the selected word line WL is raised at this time to the logical high level. On the other hand, one of the Y gate signals Yi, wherein i indicates numerals 1 to 4, is raised to the logical high level, so that the bit lines are connected to the input-output lines. Write data are transmitted to this selected bit lines via write driver 7 (FIG. 1).

It is now assumed that the Y gate signal Y1 is at the logical high level and the bit lines BL1, BL2 are connected to the input/output lines I/O1 and I/O2. At this time, the write data are transmitted to the bit lines BL1 and BL2. The data transmitted on these bit lines BL1 and BL2 are latched by latch means or column latches, not shown. This operation is repeated a predetermined number of times on one word line WL to effect writing of data for one page, or of a predetermined number of data. Such data writing is performed by activating the control signals $\overline{WE}$ and $\overline{CE}$ to the low level. After termination of writing of the predetermined number of data, external accessing is inhibited by the operation of a built-in timer or the control signal $\overline{WE}$. The internal writing operation is now initiated.

This internal writing includes an erasure operation and a programming operation. During erasure operation, the data in the memory cells connected to the selected word line are all erased. During this mode, the potential on the control gate line CGL is raised to Vpp.

Such voltage increase on the control gate line CGL is performed by, for example, control circuit means, not shown. On the other hand, the bit lines BL1 to BL8 are all set to the logical low level. Since the Y gate signals Y1 to Y4 are all at the logical low level, setting the bit lines BL1 to BL8 to the logical low level is performed by turning on the internal transistor switches, not shown, provided for each of the bit lines BL1 to BL8. On the other hand, the source line select signal SL is set to the logical high level. This renders the transistor Q10 conductive so that the source lines of the memory transistors M1 to M8 are all connected to receive the ground potential. In this state, the Vpp switch 20 is activated and the potential on the word line WL in the selected state is raised to a Vpp level higher than the logical high level. As a result, the high voltage Vpp on the control gate lines CGL is transmitted via transistor Q9 to control gates of the memory transistors M1 to M8. On the other hand, the drain electrodes of the memory transistors M1 to M8 are connected to the bit lines BL1 to BL8 via select transistors Q1 to Q8 and are in the logical low level. This causes electrons to be injected into the floating gates (203 in FIG. 3) of the memory transistors M1 to M8, to lead to termination of the erasure operation, that is, page erasure, of the memory transistors M1 to M8. This erased state corresponds to the state that the data "1" is written.

The programming operation is then performed. During this programming operation, data writing is performed only into the memory cells into which data "0" are to be written. For this programming mode, the potential on the control gate line CGL is set to the logical low level. On the other hand, the potential on the bit line to which a memory transistor undergoing the programming is connected is raised to the high voltage Vpp, while the potential on the other bit lines is set to the logical low level. Potential transmission to these bit lines is performed by activating the Vpp switch in accordance with the data latched by the column latches associated with the bit lines.

For example, when only the memory transistor M1 is programmed, the potential on the bit line BL1 is raised to the high voltage Vpp level by the Vpp switch and the column latch, not shown, the remaining bit lines BL2 to BL8 being set to the logical low level potential. During the programming operation, the source line select signal SL is at the logical low level, the MOS transistor Q10 is turned off, and the sources of the memory transistors M1 to M8 are in the electrically floating state. Under this condition, the word line WL is raised to the high voltage Vpp by the operation of the Vpp switch 20. The control gate line CGL is now at the ground potential, the bit line BL1 is at the high voltage Vpp and the word line WL is at the high voltage Vpp. Thus the high potential Vpp is transmitted to the drain of the memory transistor M1, while the control gate of the memory transistor M1 is at the ground potential GND. This causes electrons to be extracted from the floating gate of the memory transistor M1 to complete the programming. This state corresponds to the state that the data "0" is written.

In the flash erasure type semiconductor memory device, the word lines are all activated to effect data erasure of all the memory cells before proceeding to data writing, after which data writing or programming is performed in the same manner as described hereinabove.

The operation of reading out data is now explained. During data reading, the memory cells are selected similarly by the X and Y addresses. It is now assumed that the 1-byte data provided by the memory transistors M1 and M2 is to be read out. At this time, the Y gate signal Y1 from the Y decoder 5 is at the logical high level, while the potential on the word line WL is also at the logical high level by the output from the X decoder 3. The read-out potential, such as 0 V or a predetermined positive voltage, is supplied to the control gate line CGL. This read-out potential is set to a voltage intermediate between the threshold voltage of the memory transistor in the erased state and the threshold voltage of the memory transistor in the programmed state. It is now assumed that the memory transistor M1 is in the erased state, that is, stores data "1", with electrons injected therein, while the memory transistor M2 is in the programmed state and stores data "0". At this time, the memory transistor M1 is off, while the memory transistor M2 is on. During the read-out operation, the source line select signal SL is at the logical high level, while the transistor Q10 is in the turn-on state. Hence, the current flows from the bit line BL2 to the ground potential by way of transistors Q2, M2 and Q10, such current not flowing through the bit line BL1. This change in the current flow through the bit lines BL1 and BL2 is sensed by the sense amplifiers (8 in FIG. 1) connected to the input/output lines I/O1 and I/O2 so as to be converted into corresponding voltage signals that are to be transmitted to the ECC circuit.

Therefore, in the construction shown in FIG. 2, data are written and read out on the byte by byte basis.

In the above described conventional non-volatile semiconductor device, the high voltage Vpp is supplied to the gates of the select transistors Q1 to Q9 during data writing (flash erasure, page erasure and programming mode). The purpose of applying this high voltage Vpp is to cause a tunneling current to be produced in the memory transistors M1 to M8. For such tunneling current to be produced in the memory cell transistors M1 to M8, it is necessary to apply a high electric field of ten mega volts/cm between the floating gate 203 and the drain region 202 (FIG. 3). The film thickness of the gate insulating film is usually selected to be of the order of ten nanometers. For application of such high electrical field, it is necessary to employ the high voltage Vpp of the order 16 to 20 V.

On the other hand, the purpose of providing the gate insulating film of the selection transistor is simply to form a channel layer or an inversion layer for turning on and off of the transistor, and the film thickness of the gate insulating film is selected to be several tens of nanometers. However, when such high voltage Vpp is applied to the gate insulating film, the repetitive operation of writing results in destruction of the gate insulating film (the word line destruction) to cause current leakage between the drain region and the gate electrode in the selection transistor to give rise to an inconvenience that the potential on the word line is not raised to the high voltage Vpp, or the logical high level.

In such case, a selected memory cell is in the nonselected state and hence accurate data writing and/or reading cannot be realized, thus lowering the reliability of the non-volatile semiconductor memory device.

For improving the reliability of the non-volatile semiconductor memory device, it is effective to apply error detection and correction on the read-out data using error correction code. However, for performing error detection/correction using the ECC circuit, it is necessary to store not only information bits but also parity bits, while it is necessary during data read-out to produce check bits from the read-out data to compare the parity bits and the check bits with each other.

If the Hamming Codes are employed, error checking/correction such as t-plex error correction/detection may be performed. However, for a higher integration of the non-volatile semiconductor memory device, the area occupied by the ECC circuit and the parity bit storage region should be made as small as possible. For this reason, 1-bit error correction code (SEC) or a 1-bit error correction 2-bit error detection code (SEC-DED) is preferred for the error correction code.

On the other hand, in the above described conventional non-volatile semiconductor memory device, the 1-byte data to be read out simultaneously are read out from the memory transistors arranged on the same word line. Hence, on occurrence of the above described word line destruction, the read-out 1-byte data are all in error. Even if the above described error correction codes are employed, it becomes impossible to effect detection and correction for all of the 1-byte data. Thus, in case of the word line destruction, it becomes impossible to effect accurate data reading. Therefore, in the conventional construction, it is not possible to cope with the word line destruction.

A divided word line structure in which a word line comprises a major word line and a plurality of auxiliary-word lines each connected to the major word line through a logic gate is disclosed in, for example, reissued U.S. Pat. Nos. 32,993 and No. 33,280.

This structure is adopted to reduce the access time of a memory, not to repair a destroyed word line in an EEPROM.

SUMMARY OF THE INVENTION

It is an object of the present invention to provide a non-volatile semiconductor memory device according to which accurate data reading can be realized with the use of a small-scale ECC circuit even on occurrence of word line destruction.

It is another object of the present invention to provide a non-volatile semiconductor memory device according to which word line destruction can, in effect, be repaired without increasing chip area or access time.

It is a further object of the present invention to provide a non-volatile semiconductor memory device in which accurate data reading can be realized by using the ECC circuit even on occurrence of word line destruction caused by the destruction of the gate insulating film in 1-bit memory cell.

The non-volatile semiconductor memory device according to the present invention includes a plurality of internal data transmission lines for effecting data communication simultaneously with a plurality of memory cells, and divided word lines each provided corresponding with the internal data transmission lines. Memory cells to be connected to the same internal data transmission line are connected to one divided word line.

The divided word line includes a main word line for receiving an output signal of the X decoder, auxiliary word lines divided in correspondence with each of the internal data transmission lines, and means interconnecting the main word line and the auxiliary word lines. The memory cells are coupled to each auxiliary word line.

The connecting means preferably include resistor means interconnecting one end of an auxiliary word line to the main word line and an element interconnecting the other end of the auxiliary word line to the main word line only during the read-out operation.

A modified non-volatile semiconductor memory device according to the present invention includes a main word line, auxiliary word lines divided into a plurality of groups, and means responsive to a group selection signal for interconnecting the auxiliary word lines of a selected group to the main word line. Each of the groups of the auxiliary word lines includes a plurality of auxiliary word lines associated with respective internal data transmission lines. Data communication is performed between the memory cells of one auxiliary word line group and all of the internal data transmission lines.

Destruction of the gate insulating film in the memory cell occurs first at the memory cell having the most brittle gate insulating film. The potential on the auxiliary word line connected to this defective memory cell is not raised. However, the potential on the remaining auxiliary word lines is raised to the high voltage Vpp or to the logical high level, since destruction of the gate insulating film is not caused in the memory cell connected to the remaining auxiliary word lines. Since the auxiliary word lines are provided in association with the internal data transmission lines, only one bit out of the simultaneously accessed memory cell data is in error even on occurrence of the word line destruction. Thus it becomes possible to perform data error detection/correction by an ECC circuit even on occurrence of the word line destruction.

The interconnecting means has the function of not causing the potential on the main word line to be lowered by the reduced potential of a destroyed auxiliary word line, due to destruction of a selection transistor.

With the auxiliary word line thus arranged into groups, the effects of the lowered potential on a destructed auxiliary word line on the remaining auxiliary word lines can be eliminated more completely, while it also becomes possible to accommodate the word line destruction, as well as to relieve the load on the word line to shorten the access time.

The foregoing and other objects, features, aspects and advantages of the present invention will become more apparent from the following detailed description of the present invention when taken in conjunction with the accompanying drawings.

DESCRIPTION OF PREFERRED EMBODIMENTS

Figure 2:
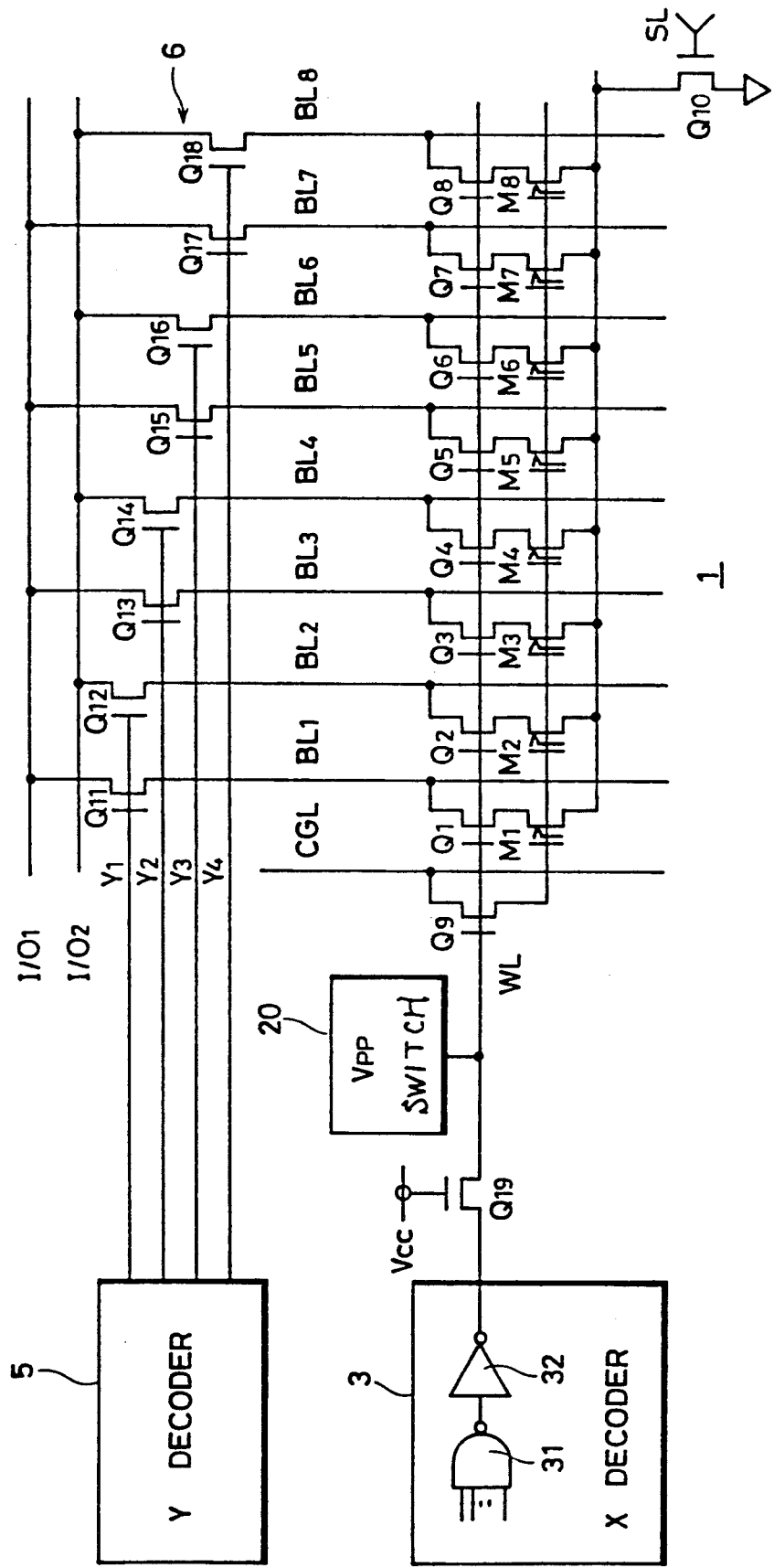
FIG. 2 shows the construction of a major part of the conventional non-volatile semiconductor memory device.
Figure 3:
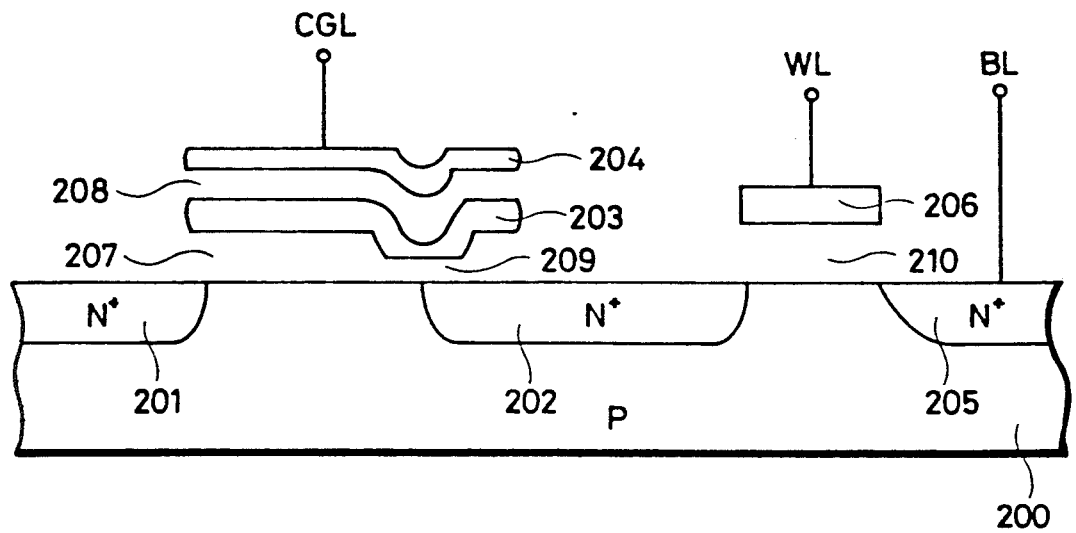
FIG. 3 is a diagrammatic view showing the cross section of an EEPROM cell.
Figure 4:
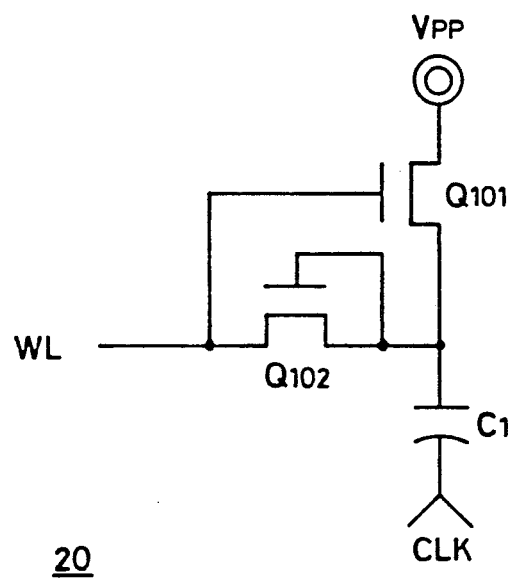
FIG. 4 is a diagrammatic view showing the construction of a Vpp switch.
Figure 5:
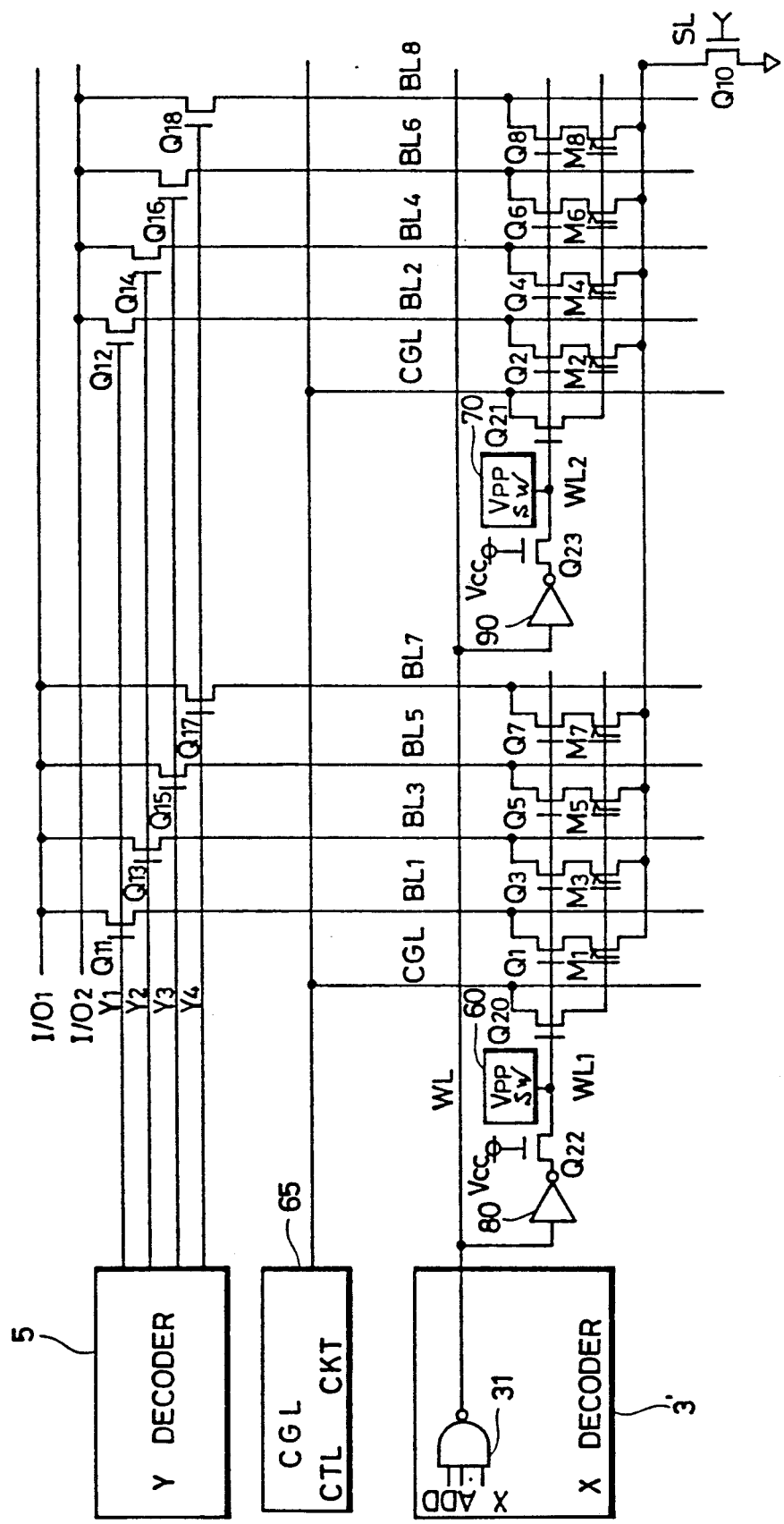
FIG. 5 is a diagrammatic view showing essential parts of a non-volatile semiconductor memory device according to a first embodiment of the present invention.

FIG. 5 shows diagrammatically the construction of essential parts of a non-volatile semiconductor memory device according to a preferred embodiment of the present invention. In this figure, parts or components corresponding to those shown in FIG. 2 are indicated by the same reference numerals. Referring to FIG. 5, a word line WL is divided into auxiliary word lines WL1 and WL2 in association with the internal data transmission lines or input/output lines I/O1 and I/O2. Those memory cells that are to be connected to the input/output line I/O1 are connected to the auxiliary word line WL1. Those memory cells that are to be connected to the auxiliary word line WL2 are the memory cells to be connected to the internal data transmission line I/O2. Thus respective gates of selection transistors Q1, Q3, Q5 and Q7 are connected in common to the auxiliary word line WL1. The selection transistors Q1, Q3, Q5 and Q7 are responsive to the Y selection signals Y1, Y2, Y3 and Y4, so as to be connected to the internal data transmission line or input/output line I/O1 via bit lines BL1, BL3, BL5 and BL7 and transistors Q11, Q13, Q15 and Q17, respectively.

To one end of the auxiliary word line WL1, there is provided a Vpp switch 60 for raising the potential on the auxiliary word line WL1 to the high voltage Vpp level during writing operation. The auxiliary word line WL1 is connected to the main word line WL by way of an inverter 80 and a MOS transistor Q22. The inverter 80 outputs a voltage which is an inversion of the potential on the main word line WL.

The gate of the transistor Q22 is supplied with the source voltage Vcc. The output of the inverter 80 is transmitted via transistor Q22 to the auxiliary word line WL1. The transistor Q22 prevents the high voltage Vpp generated during the operating state of the Vpp switch 60 from being transmitted to the inverter 80. The control gates of the memory transistors M1, M3, M5 and M7 are connected to a control gate line CGL via transistor Q20. The gate of a transistor Q20 is connected to the auxiliary word line WL1.

The auxiliary word line WL2 is connected in common to the gate of the control gate control transistor Q21 and to the gates of the selection transistors Q2, Q4, Q6 and Q8. The control gates of the memory transistors M2, M4, M6 and M8 are connected to the control gate line CGL via transistor Q21. The transistors Q2, Q4, Q6 and Q8 are connected to the internal data transmission line I/O2 via bit lines BL2, BL4, BL6 and BL8 and transistors Q12, Q14, Q16 and Q18, respectively. The gates of the transistors Q12, Q14, Q16 and Q18 are supplied with the Y gate signals Y1, Y2, Y3 and Y4, respectively.

A Vpp switch 70 is provided at one end of the auxiliary word line WL2, which is connected to the main word line WL via inverter 90 and transistor Q23. The gate of the transistor Q23 is supplied with the source voltage Vcc. This causes the potential on the main word line WL to be transmitted via inverter 90 and transistor Q23 to the auxiliary word line WL2. The source electrodes of the memory cell transistors M1, M3, M5, M7, M2, M4, M6 and M8 are connected to receive the ground potential via transistor Q10. This transistor Q10 is turned on responsive to the control signal SL.

Meanwhile, the X decoder 3' includes a NAND gate 31 as a unit decoder. Thus the potential on a selected main word line WL is set to the logical low level, while the potential on a non-selected main word line is set to the logical high level.

Figure 1:
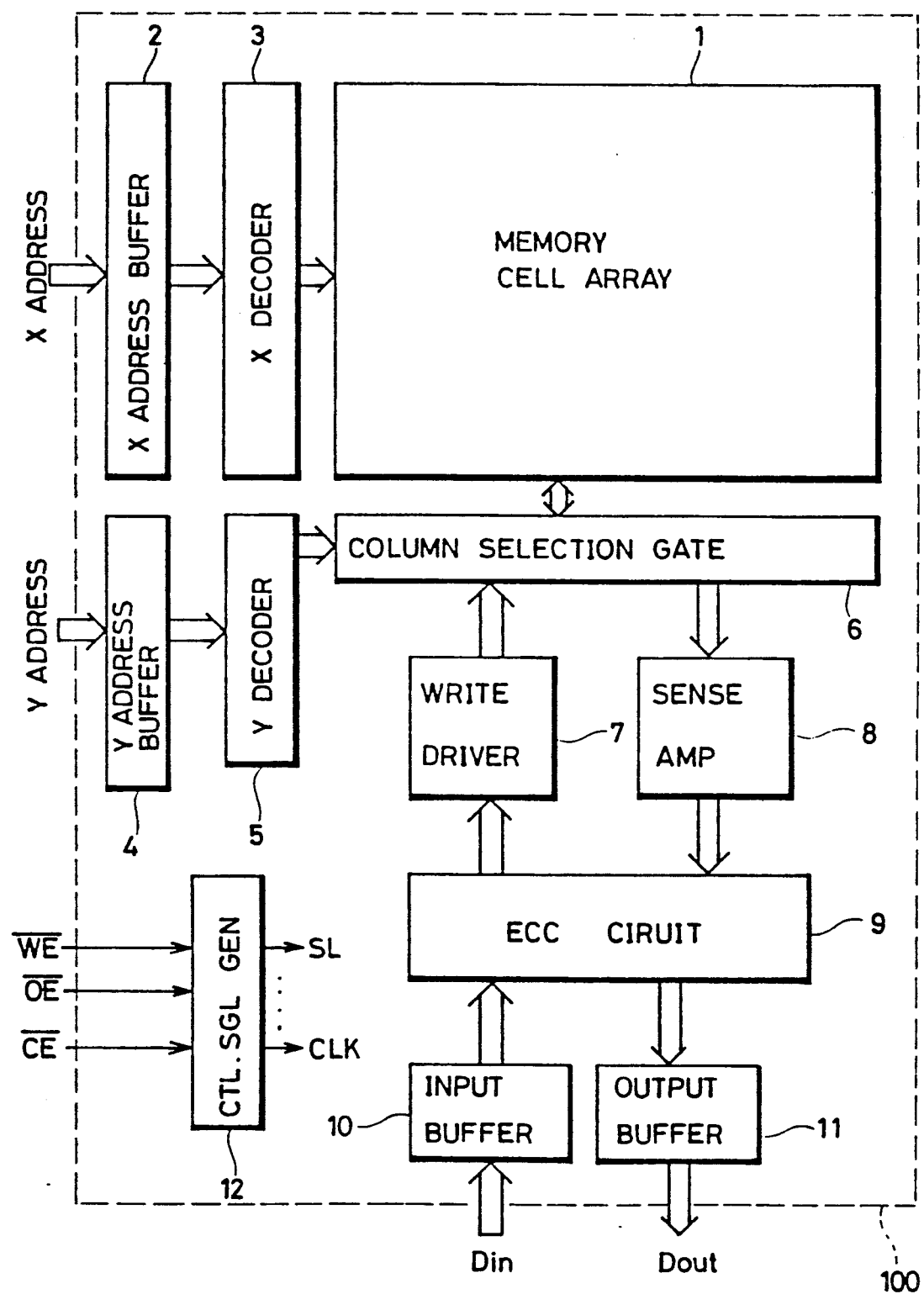
FIG. 1 shows an exemplary construction of a conventional non-volatile semiconductor memory device.

The control gate lines CGL are all connected in common to a CGL control circuit 65. This CGL control circuit 65 is included in the control signal generating circuit 12 shown in FIG. 1 and functions to transmit a predetermined voltage on the control gate lines CGL. The operation of the memory device is described briefly by taking as an example a flash type EEPROM.

Before writing data, a batch erasure, that is the operation of erasing all of the memory cell data in the semiconductor memory device is performed. In this case, responsive to the control signals $\overline{WE}$, $\overline{CE}$, the potential on all of the main word lines WL is set to the selected state, that is, to the logical low level. This causes the potential on the auxiliary word lines WL1 and WL2 to be at the logical high level. The Vpp switches 60 and 70 are then actuated to raise the potential on the auxiliary word lines WL1 and WL2 to the high voltage Vpp level. At this time, the potential on the control gate lines CGL is raised to the level of the high voltage Vpp under control of the CGL control circuit 65. The bit lines BL1 to BL8 are all set to the ground potential by discharging means, not shown, provided on each bit line. This causes electrons to be injected into the floating gates of the memory cell transistors M1 to M8 to complete the erasure on all of the memory cell transistors.

Data writing is then performed. During this programming operation, the control signal $\overline{WE}$ is set to the logical low level, and the control signal $\overline{CE}$ is set to the logical low level. Thus the main word line WL is selected by the X decoder 3', on the basis of the X and Y addresses supplied from an exterior, so that the potential on the selected main word line WL is set to the logical low level. On the other hand, by the Y gate signal from the Y decoder 5, write data are transmitted on the selected bit lines via data transmission lines I/O1 and I/O2 on a byte basis. The data thus applied over the bit lines are latched by latch means, that is, column latches, not shown. After the end of data writing in a required number of the memory cells connected to one main word line WL, the Y gate signal from the Y decoder is set to the logical low level and the memory cell array is separated from the internal data transmission lines I/O1 and I/O2. Then, by the function of the Vpp switches 60 and 70, the potential on the auxiliary word lines WL1 and WL2 is raised to the level of the high voltage Vpp, at the same time that the potential on the bit line connected to the memory to be programmed, for example, the bit line BL1, is raised to the high voltage Vpp, in dependence upon the latched write data. The control gate line CGL is set to the logical low level. At this time, the source line select signal SL is at the logical low level, so that the transistor Q10 is in the turn-off state. This permits data to be written into desired memory cell or cells.

The Vpp switches 60 and 70 are able to simply raise the potential on the auxiliary word lines WL1 and WL2, respectively. The capability of a Vpp switch required for raising the potential is usually determined by its bootstrap capacity and the current supply ability of the MOS transistor therein. Thus the capacitance of the capacitor and the size of the transistors of each of the Vpp switches 60 and 70 are set so as to be smaller than those of the conventional system. At this time, even if destruction should have been caused in, for example, the auxiliary word line WL1, there is no risk for the potential on the auxiliary word line WL1 to affect the main word line WL, by virtue of the function of the inverter buffer 80, such that the current leakage due to destruction of the gate insulating film occurs only on the auxiliary word line WL1.

The data read-out is performed as conventionally. As can be seen from FIG. 5, those memory cells that are connected to the internal data transmission line I/O1 are connected to the auxiliary word line WL1, while those memory cells that are connected to the internal data transmission line I/O2 are connected to the auxiliary word line WL2. Hence, by the Y gate signal from the Y decoder 5, one memory cell is selected from each of the auxiliary word lines WL1 and WL2.

It is now assumed that word line destruction has been caused in the auxiliary word line WL1. In such case, the potential on the auxiliary word line WL1 is not raised to the high voltage Vpp during data programming, so that erasure or programming of the memory cell data is performed insufficiently. Therefore, the data written into the memory cells associated with this auxiliary word line WL1 may be in error. Also, during data read-out, when the auxiliary word line WL1 is subjected to current leakage via the memory cell whose gate insulating film has been destructed, and the potential thereat is raised only up to 1 to 2 V, there may be a case that the selected transistor is not turned on sufficiently, and the change in the current flow on the bit line is so small as to cause errors in the data detection by the sense amplifier. However, in such case, data reading and writing are performed accurately on the auxiliary word line WL2, so that, among the 1-byte memory cell data, it is the data on the internal data transmission line I/O1, associated with the auxiliary word line WL1, that are in error. Therefore, if one bit data is in error, data error may be detected and corrected by an ECC circuit to effectively repair that word line destruction.

In addition, a word line is divided in association with the internal data transmission lines I/O1 and I/O2, and the capacitance of each of the auxiliary word lines is significantly reduced as compared with the conventional system, so that it is possible to reduce the word line capacitance. Thus the time necessitated in raising and lowering the potential on the auxiliary word lines WL1 and WL2 can be made lesser than in the conventional system, resulting in improved accessing speed.

In the construction of FIG. 5, detection and correction of the read-out data is made using a 1-bit error detection and correction code (SEC), while the capacitance of a word line, more precisely, of the auxiliary word lines, is reduced due to word line division, so that access time can be reduced.

An inverter is provided in each of the auxiliary word lines in the above embodiment for shortening the driving time of each of the auxiliary word lines. It is, however, possible to reduce further the load on the word line to reduce the access time as well as an adverse effect of the word line destruction.

Figure 6A:
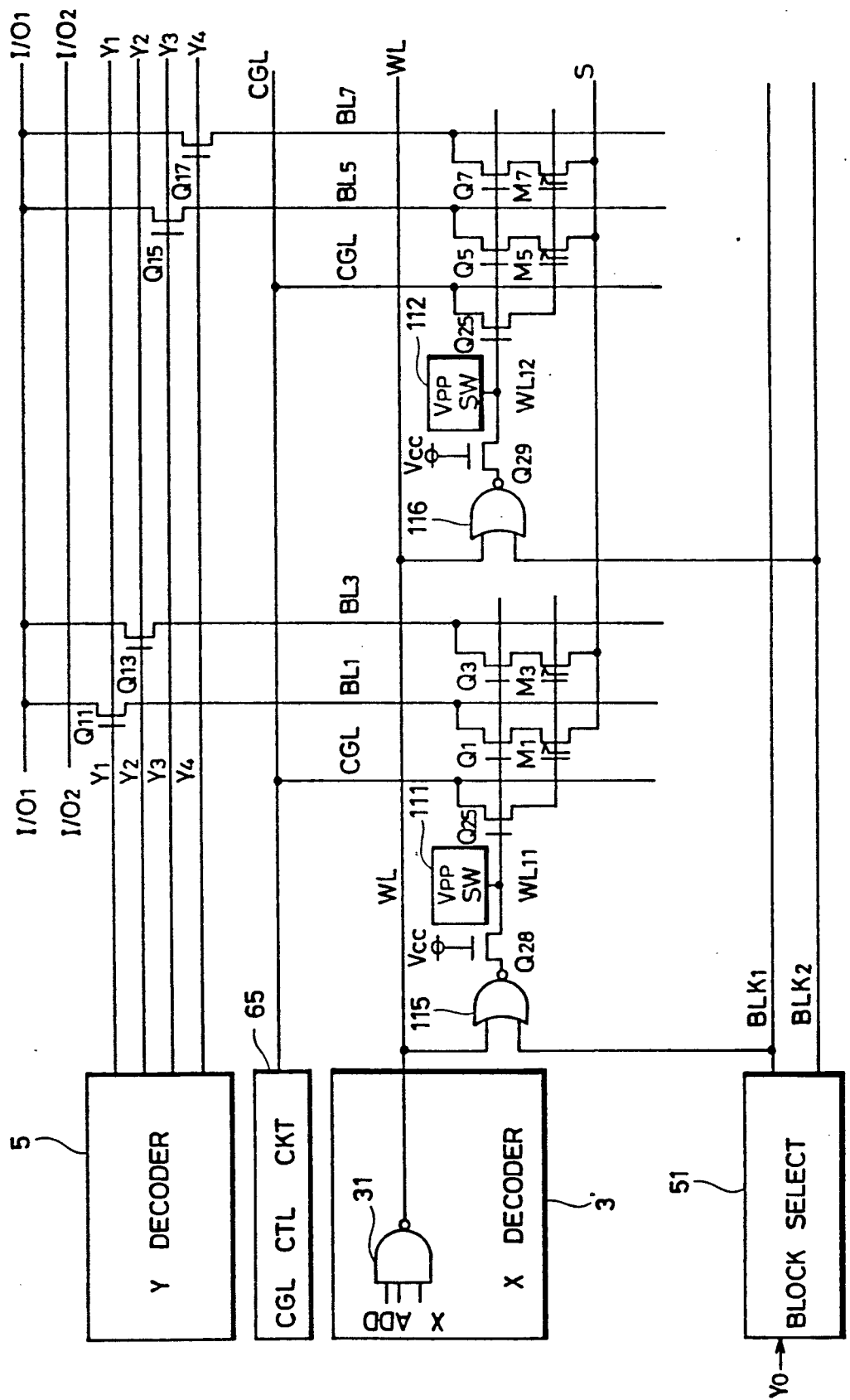
FIGS. 6A and 6B show the construction of essential parts of a non-volatile semiconductor memory device according to a second embodiment of the present invention.
Figure 6B:
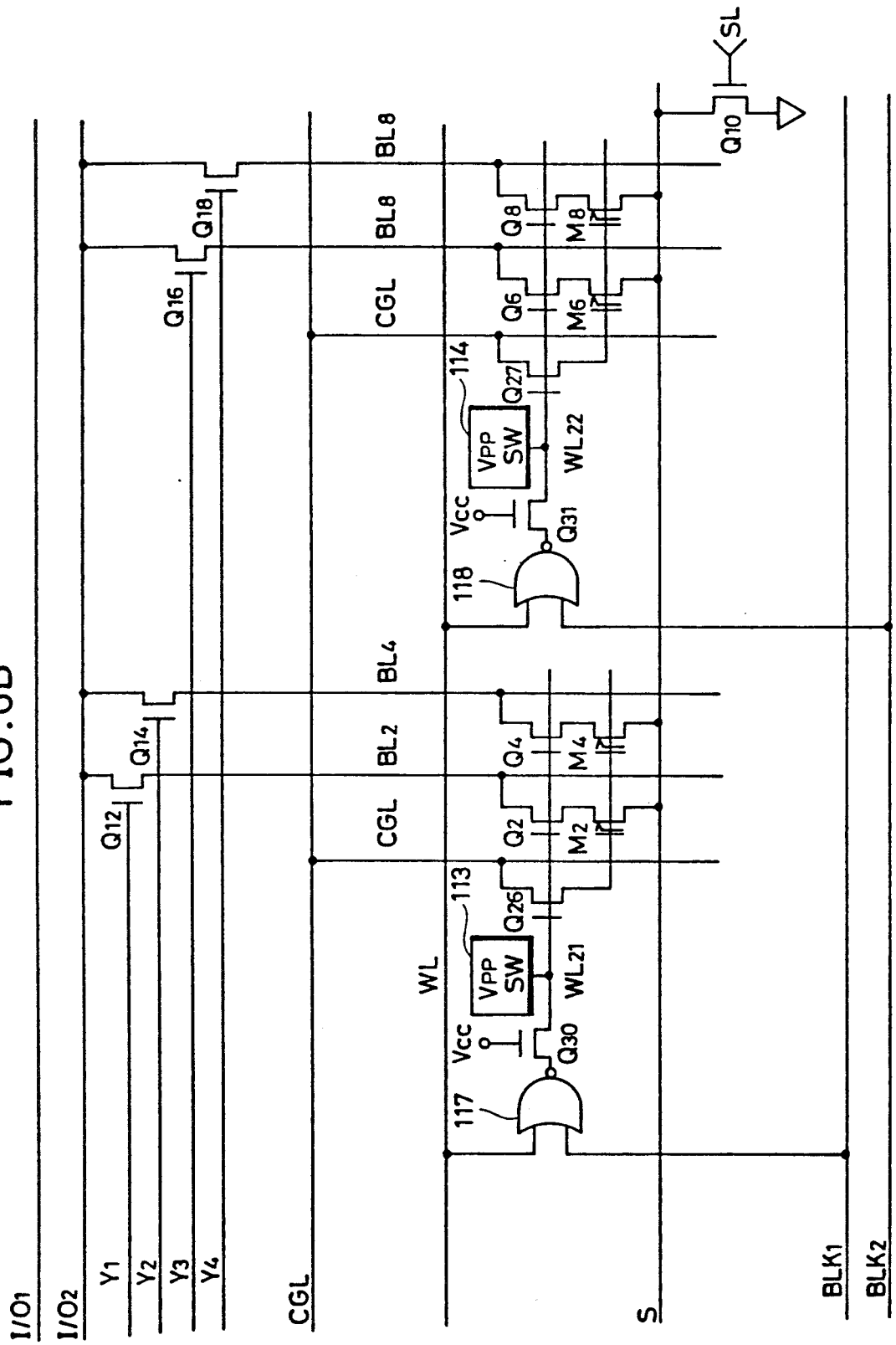

FIGS. 6A and 6B illustrate the construction of the second embodiment of the non-volatile semiconductor memory device according to the present invention. Referring to FIGS. 6A and 6B, the auxiliary word line WL1 and WL2 are further divided into the auxiliary word lines WL11, WL12 and WL21, WL22, respectively.

The auxiliary word line WL11 is connected to the gates of transistors Q24, Q1 and Q3, while the auxiliary word line WL12 is connected to the gates of the transistors Q25, Q5 and Q7.

The auxiliary word line WL21 is connected to the gates of the transistors Q26, Q2 and Q4. The auxiliary word line WL22 is connected to the gates of the transistors Q27, Q6 and Q8.

The transistor Q24 couples the control gate line CGL to the control gates of the memory transistors M1 and M3. The transistor Q25 couples the control gates of the memory transistors M5 and M7 to the control gate line CGL. The transistor Q26 couples the control gates of the memory transistors M2 and M4 to the control gate line CGL. The transistor Q27 couples the control gates of the memory transistors M6 and M8 to the control gate line CGL.

In the above described construction, the auxiliary word lines WL11 and WL21 make up an auxiliary word line group, while the auxiliary word lines WL12 and WL22 make up another auxiliary word line group, as shown in FIGS. 6A and 6B.

For selecting a group, NOR gates 115, 116, 117 and 118 are provided in the auxiliary word lines WL11, WL12, WL21 and WL22, respectively. A potential on the main word line WL is supplied to one input of the NOR gate 115, and a block select signal BLK1 from a block selector 51 is supplied to the other input of that gate 115. A potential on the main word line WL is also supplied to one input of the NOR gate 116, and a block select signal BLK2 from the block selector 51 is supplied to the other input of that gate 116. A signal potential on the main word line WL is further supplied to one input of the NOR gate 117, while a block select signal BLK1 from the block selector 51 is also supplied to the other input of that gate 117. The potential on the main word line WL is further supplied to one input of the NOR gate 118, while the block select signal BLK2 from the block selector 51 is also applied to the other input of that gate 118.

The output of the NOR gate 115 is supplied via transistor Q28 to the auxiliary word line WL11. The output of the NOR gate 116 is supplied via transistor Q29 to the auxiliary word line WL12. The output of the NOR gate 117 is supplied via the transistor Q30 to the auxiliary word line WL21. The output of the NOR gate 118 is supplied via transistor Q31 to the auxiliary word line WL22. The source potential Vcc is supplied to each of the gates of the transistors Q28 to Q31.

Vpp switches 111, 112, 113 and 114 are provided on the auxiliary word lines WL11, WL12, WL21 and WL22, respectively. The transistors Q28 to Q31 have the function of cutting off the high voltage during operation of the Vpp switches 111 to 114, respectively.

The X decoder 3' has a NAND gate 31 as its unit decoder, and the output thereof is at the logical low level potential when the word line is selected, and it is at the logical high level potential when the word line WL is not selected.

During data read-out, the most significant bit Y0 of the Y address, for example, is inputted into the block selector 51, which then outputs, in accordance with the most significant 1-bit Y address, the block select signals BLK1 and BLK2. Thus, when the group of the auxiliary word lines WL11 and WL21 are selected, the block select signal BLK1 goes to the low level, while the block select signal BLK2 goes to the high level. Conversely, when the group of the auxiliary word lines WL12 and WL22 is selected, the block select signal BLK1 goes to the high level, while the block select signal BLK2 goes to the low level. This block selector 51 may be arranged as a 1-bit decoder composed simply of an inverter and a buffer. The remaining construction is the same as that shown in FIG. 5. The operation of the present embodiment is now explained.

During data writing, the main word line WL is set to the select state, that is, to the logical low level, the output signals BLK1 and BLK2 of the block selector 51 are both set to the logical low level and the auxiliary word lines WL11, WL12, WL21 and WL22 are set to the high voltage Vpp.

During flash erasure, the potential on all of the main word lines WL is set to the logical low level. The potential on the control gate line CGL is set to the potential of the high voltage Vpp level, while the potential on the bit lines BL1 to BL8 is set to the ground potential, that is, 0 V. This causes electrons to be injected into the floating gates of the memory transistors M1 to M8 to complete the erasure of the memory transistor data.

For data writing, the potential on the bit lines is raised to the high voltage Vpp level, while the potential on the control gate line CGL is set to the logical low level, in accordance with the latched write data, as in the arrangement shown in FIG. 5. This causes electrons to be extracted from the floating gates of the memory cells in which data "0" are to be written, to effect data writing in the desired memory cells.

For data writing, the source select signal SL is set to the logical high level during flash erasure and to the logical low level during programming.

Turning to the data read-out operation, it is assumed that a 1-byte data provided by the memory transistors M1 and M2 are to be read out. At this time, the potential on the main word line WL is set to the logical low level by the NAND gate 31 of the X decoder 3', while the Y gate signal Y1 from the X decoder 3' goes to the logical high level. Similarly, the block select signal BLK1 from the block selector 51 goes to the low level, while the block select signal BLK2 goes to the high level. Thus the output from the NOR gates 115 and 117 are raised to the high level, causing the potential on the auxiliary word lines WL11 and WL21 to go to the logical high level. On the other hand, the signal SL goes to the logical high level. The data in the selected memory cells M1 and M2 are transmitted via bit lines BL1, BL2 and transistors Q11 and Q12 to the internal data transmission lines I/O1 and I/O2. Then, the data are read out via the sense amplifiers.

In the present illustrative construction, the number of the memory cells connected to the auxiliary word lines WL11, WL12, WL21 and WL22 becomes smaller than in the construction comprised of the auxiliary word lines WL1 and WL2 of FIG. 5, and the load thereon is correspondingly reduced. Thus the time necessitated in raising and lowering the potential on the auxiliary word lines WL11 and WL22 may be reduced as compared with the arrangement shown in FIG. 5 to permit accessing at a higher speed.

Also, even when word line destruction occurs it is similarly only one bit in one byte that is in error, so that a repair can be in effect made for that word line destruction by using an error detection and correction code such as SEC or SEC-DED. Meanwhile, inasmuch as an auxiliary word line is divided into a larger number of groups than in the construction of FIG. 5, the number of the memory cells affected by destruction of one auxiliary word line can be reduced as compared with the system shown in FIG. 5 to reduce further the adverse effect of the word line destruction.

In the construction shown in FIGS. 6A and 6B, the auxiliary word lines are divided into two groups and the group selection is performed by the block select signals BLK1 and BLK2. However, the auxiliary word line may be divided into a still larger number of groups. In such a case, increase of the number of the block select signals BLK accommodates the increase in the number of the groups. In such case, the block selector may be formed by decoders adapted to receive a part of Y address as input, for example.

In the arrangement shown in FIG. 5, the inverters 80 and 90 are provided for driving the auxiliary word lines WL1 and WL2. However, these inverters 80 and 90 may be eliminated to increase further integration degree of the memory device.

Figure 7:
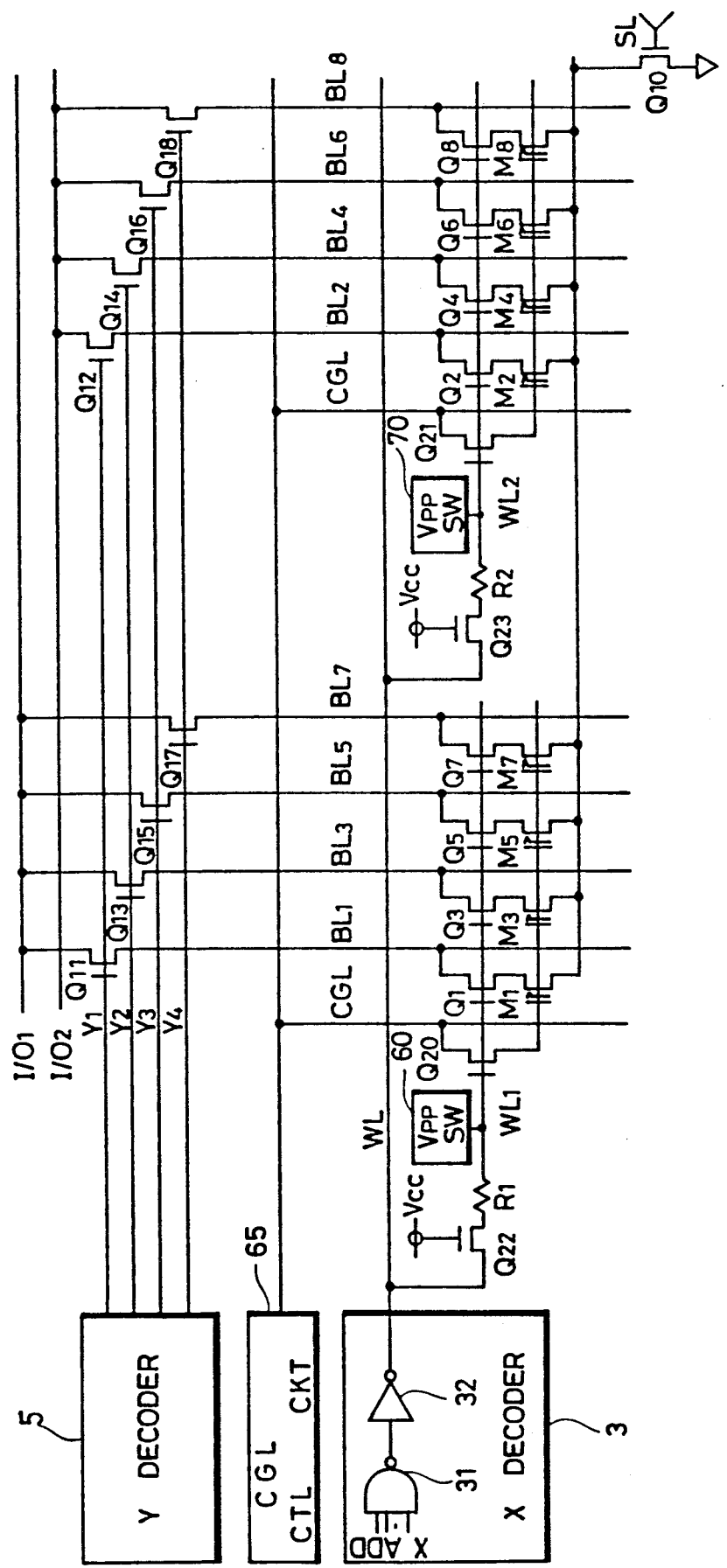
FIG. 7 shows the construction of essential parts of a non-volatile semiconductor memory device according to a third embodiment of the present invention.

FIG. 7 shows the arrangement of a third embodiment of the present invention for improving the degree of integration of the memory device. Referring to FIG. 7, the auxiliary word line WL1 is connected via the transistor Q22 and resistor R1 to the main word line WL. The auxiliary word line WL2 is connected via the transistor Q23 and resistor R2 to the main word line WL. The X decoder 3 is made up of a NAND gate 31 and an inverter 32. Thus, when the main word line WL is selected, the potential thereat is at the logical high level.

The purpose of providing the resistors R1 and R2 is to prevent the main word line WL from being affected by the lowering in the potential on the auxiliary word lines WL1 and WL2 caused by word line destruction. The transistors Q22 and Q23 function to cut off the high voltage caused during operation of the Vpp switches 60 and 70. The Vpp switches 60 and 70 are of low driving capability which is only enough to raise the corresponding auxiliary word lines WL1 and WL2 to the Vpp level. When the potential on the main word line WL becomes lower than the source potential Vcc due to the destruction of an auxiliary word line, transistors Q22 and Q23, the gates of which are supplied with the source potential Vcc and the sources of which are connected to the main word line WL, are rendered conductive, so that the auxiliary word lines WL1 and WL2 are connected to the main word line WL. Therefore, in this case, the Vpp switches 60 and 70 are required to drive also the main word line WL to have the load capacitance thereof increased. Thus the Vpp switches are unable to raise the potential on the auxiliary word lines WL1 and WL2 to the Vpp level. The transistors Q22, Q23 and the resistors R1, R2 are provided to prevent this possible situation from occurring.

On the other hand, the X decoder is of a driving capacity large enough to drive both the auxiliary word lines WL1 and WL2.

In the above described arrangement, the auxiliary word lines WL1 and WL2 are divided in association with the internal data transmission lines I/O1 and I/O2, so that, even when word line destruction has been caused in one of the auxiliary word lines, it is only one bit in the simultaneously read-out 1-byte memory cell data that is in error. It is therefore possible to make a repair for the word line destruction by using an ECC code such as SEC or SEC-DED code.

In the above construction, since it is unnecessary to provide inverters for driving the auxiliary word lines WL1, WL2, it becomes possible to simplify the circuit for driving the auxiliary word lines and to reduce the area occupied by the circuit as well as to enable high integration of the semiconductor memory device.

In the arrangement shown in FIG. 7, MOS transistors and resistors are employed for connecting the auxiliary word lines WL1, WL2 to the main word line WL. However, this arrangement may be further simplified for achieving a higher degree of integration.

Figure 8:
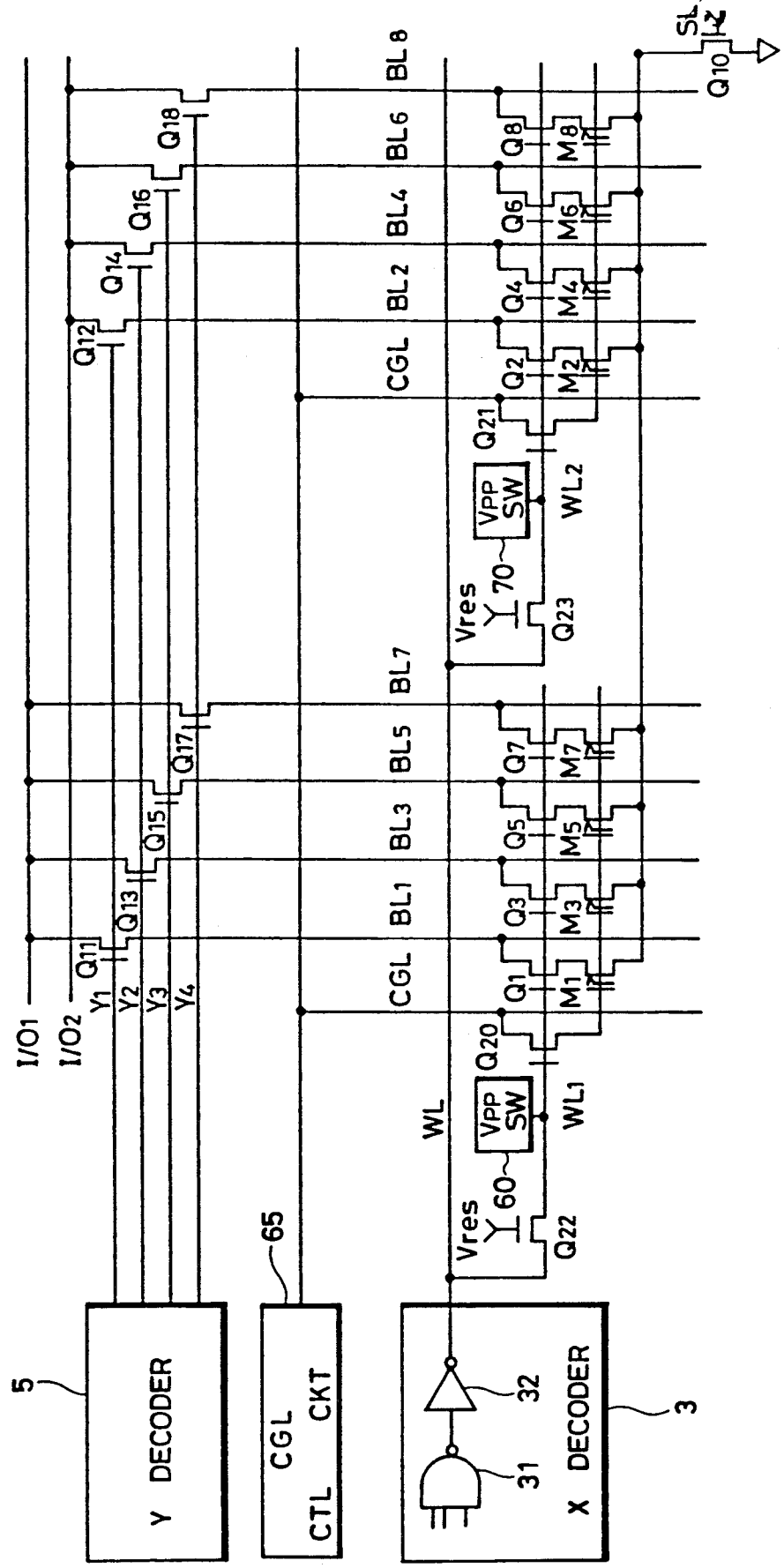
FIG. 8 shows the construction of essential parts of a non-volatile semiconductor memory device according to a fourth embodiment of the present invention.

FIG. 8 shows the construction of a non-volatile semiconductor memory device according to a fourth embodiment of the present invention. In the arrangement of FIG. 8, the auxiliary word lines WL1 and WL2 are connected to the main word line WL via MOS transistors Q22 and Q23, respectively. A predetermined voltage Vres lower than the source voltage Vcc is applied to the gates of these transistors Q22, Q23. In general, the lower the voltage applied to the gate of a MOS transistor, the larger becomes its on-resistance. Therefore, the arrangement of applying the voltage Vres lower than the source voltage Vcc to the gates of the transistors Q22 and Q23 is tantamount to containing the function of the resistors R1 and R2 shown in FIG. 7. At this time, the transistors Q22 and Q23 naturally have the high-voltage cut-off function as well.

In general, a MOS transistor is able to pass therethrough only the voltage applied to its gate less its threshold voltage. Thus, even when the potential at the main word line WL is raised to a logical high level of the order of 5 V, the transistors Q22, A23 transmit a voltage Vres - Vth to the auxiliary word lines WL1 and WL2, respectively. Therefore, when the voltage Vres is set to, for example, 4 V, the potential on the auxiliary word lines WL1, WL2 may be raised up to 3.2 to 3.5 V at most. However, since the potential at the auxiliary word lines WL1 and WL2 is raised to the Vpp level by the Vpp switches 60 and 70 during data writing operation, such low voltage applied to the gates of the auxiliary word lines WL1, WL2 does not affect the data write operation.

During data reading, such low voltage is similarly applied to the auxiliary word lines WL1 and WL2. However, the voltage applied to the control gate of a memory transistor in such state is the read-out voltage which is lower than the voltage Vres. On the other hand, the threshold voltage of the selection transistor is much lower than the voltage Vres - Vth. Thus it becomes possible to cause current changes sufficiently conforming to the stored data on the bit lines, so that any adverse effects on the read-out operation can be eliminated.

Assuming that word line destruction has been caused in the auxiliary word line WL1, for example, so that its potential is not raised, the transistor Q22 has a larger on-resistance because its gate voltage is the low voltage Vres, so that the adverse effect on the main word line WL of the lowering of the voltage on the auxiliary word line WL1 can be minimized.

In the arrangement of FIG. 8, the auxiliary word lines WL1 and WL2 are connected to the main word line WL via a transistor as a resistor, so that the circuit construction can be simplified to result in improved degree of integration of the semiconductor memory device.

Figure 9:
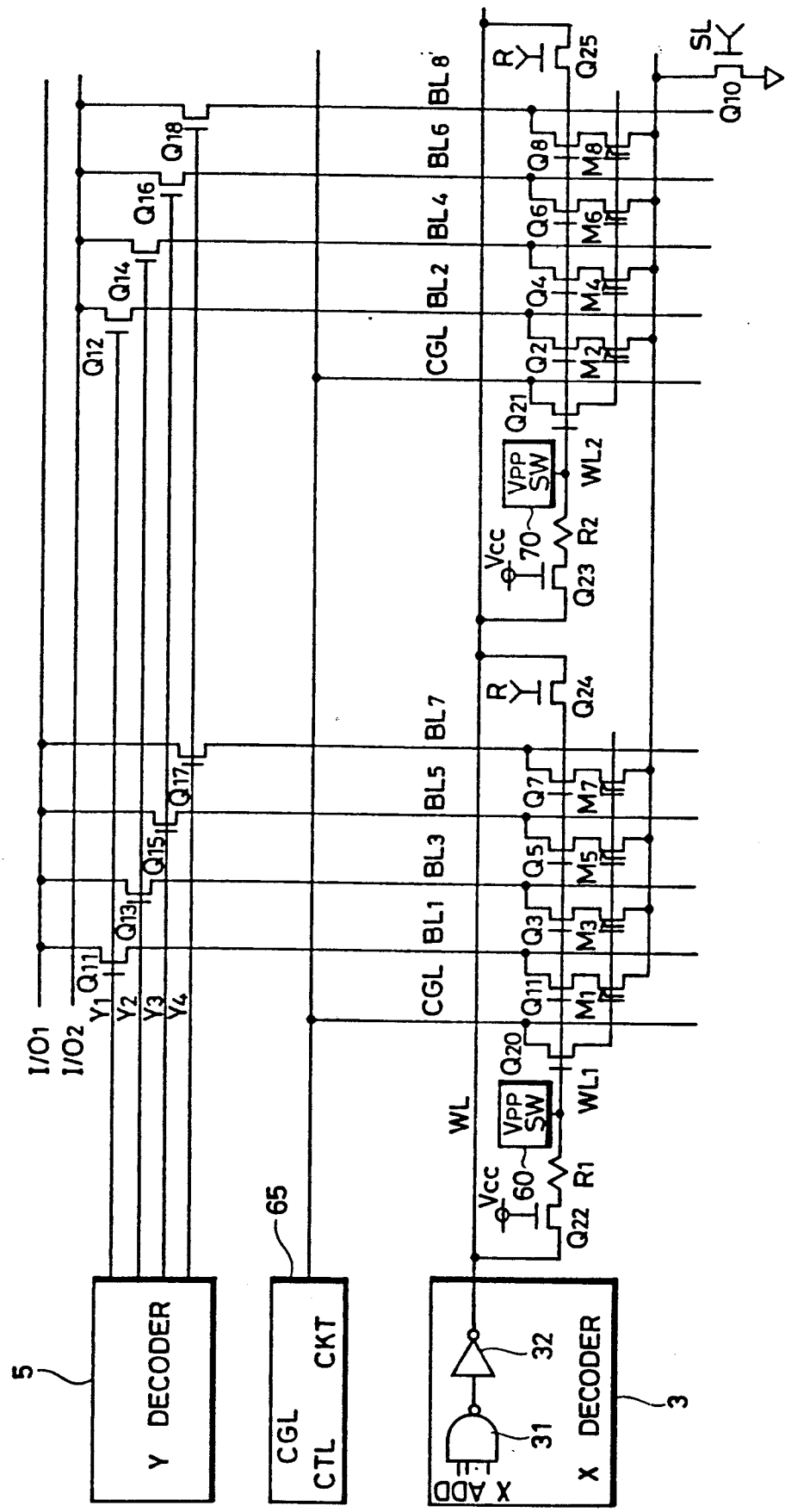
FIG. 9 shows the construction of essential parts of a non-volatile semiconductor memory device according to a fifth embodiment of the present invention.

Meanwhile, in the arrangement of FIGS. 7 and 8, the auxiliary word lines WL1 and WL2 are connected to the main word line WL via resistors or transistors. In such case, even if the X decoder 3 has a sufficiently large driving capacity, it takes much time until the auxiliary word lines WL1 and WL2 are charged to a predetermined potential. During the data writing operation, the predetermined potential may be reached quickly by the function of the Vpp switches 60 and 70, even if the potential at the auxiliary word lines WL1 and WL2 is not raised sufficiently. However, this voltage raising means are not in operation during data reading, so that it takes much time in raising the potential of the auxiliary word lines WL1 and WL2 and therefore in reading out of data. Although the inverter 32 in the X decoder 3 is designed with a large driving capacity for affording a sufficiently short access time during data reading, it is possible to reduce further this access time. FIG. 9 shows such construction.

Referring to FIG. 9, the auxiliary word line WL1 has its one end connected to the main word line WL via transistor Q22 and resistor R1 and its other end connected to the main word line WL via MOS transistor Q24. The auxiliary word line WL2 has its one end connected via transistor Q23 and resistor R2 to the main word line WL and its other end connected to the main word line WL via MOS transistor Q25. The source voltage Vcc is applied to the gates of the transistors Q22 and Q23. A read-out instruction signal R, which is generated only during the mode of the data read-out operation, is applied to the gates of the transistors Q24 and Q25. This read-out instruction signal R is generated by the control signal generating circuit 12 shown in FIG. 1.

During data writing, the auxiliary word lines WL1, WL2 are connected to the main word line WL only by way of transistor Q22 and resistor R1, and transistor Q23 and resistor R2, respectively. Thus the data writing is in FIG. 7.

On the other hand, during data read-out, main word line WL is connected to the auxiliary word lines WL1 and WL2 by way of the transistors Q24 and Q25 in the turn-on state, in addition to the transistors Q22 and Q23 and resistors R1, R2. Thus the auxiliary word lines WL1 and WL2 can be charged at a higher rate for reducing the access time for data reading.

It is now assumed that word line destruction has been caused in the auxiliary word line WL1. In such case, current leakage at the auxiliary word line WL1 causes the potential on the main word line WL to be lowered via transistor Q24 in the turn-on state. However, the word line driving capacity of the X decoder 3 is designed to be large enough to maintain the potential level on the main word line WL at a minimum required level of, for example, 3 V, despite leakage occurring at the auxiliary word line WL1. Therefore, while the auxiliary word lines may be charged to this voltage level, the selection transistors can be in the sufficiently on state for the read-out operation so that current changes conforming to the stored data can be produced in the associated bit lines.

In the arrangement shown in FIG. 9, the auxiliary word line WL1 and WL2 can be charged from both ends, that is, via the resistor at one end and via low-resistance transistor at the other end, so that the auxiliary word lines WL1 and WL2 can be charged at a higher rate than in the case of charging via one resistor, whereby data access time during data read out operation can be shortened significantly.

Meanwhile, description of the above embodiments has been made of a flash EEPROM employing floating-gate type memory transistors. However, the above described arrangement can also be applied to a page erasure type EEPROM in which only the memory cells connected to one word line are subjected to erasure at a time, or to a UV erasure type EPROM. It can also be applied to an EEPROM in which data erasure is made on the byte by byte basis.

The memory transistors may also be of any other type than the floating gate tunnel insulating film type. Turning to the arrangement of the memory cell, it is possible to obtain the effects similar to those obtained in the above described embodiments with any other arrangement than the above described embodiment in which each memory cell is made up of one selection transistor and one memory transistor, such as, for example, one transistor/1 bit structure.

If two or more bit error checking and correcting circuit is provided in a memory, any block of the memory may include bit lines connected to two or more different I/O lines, which bit lines are simultaneously selected.

Thus the present invention can be applied to any memory device provided with a plurality of internal data input/output lines and in which the data input/output is performed by a unit of plural bit lines.

According to the present invention, as described hereinabove, a word line is divided in association with a plurality of internal data transmission lines, so that, even on occurrence of word lines destruction, it is only one bit among the memory cell data composed of simultaneously read-out bits, that is in error. Therefore, word line destruction can be relieved using an error detection and correction code such as SEC or SEC-DED code, and a non-volatile semiconductor memory device having high degree of reliability can be obtained.

In a case in which a main word line and auxiliary word lines are connected by way of a low resistance only during data read-out mode, the auxiliary word lines can be charged quickly during data read-out for reducing the access time significantly.

Also, in a case wherein a word line is divided into plural auxiliary word lines in association with the internal data transmission lines, or wherein the auxiliary word lines are further divided into groups of auxiliary word lines, the word line capacitance can be reduced to realize high speed accessing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile embodiment semiconductor memory device comprising:
    a plurality of word lines,
    a plurality of bit lines so arranged to intersect said word lines,
    a plurality of memory cells, one arranged at each intersection of said word lines and said bit lines for non-volatile data storage, and
    a plurality of data transmission lines each for communicating data with a selected one of said memory cells at a time,
    each of said word lines comprising;
    a main word line for transmitting a row selection signal,
    a plurality of auxiliary word lines each having connected thereto a plurality of the memory cells, each of the memory cells of an auxiliary word line being singly connectable to the same data transmission line, and
    means for interconnecting each of said auxiliary word lines to said main word line.

2. The non-volatile semiconductor memory device according to claim 1, further comprising high voltage generating means provided for each of said auxiliary word lines for raising the voltage on an associated auxiliary word line to a voltage higher than an operating source voltage.

3. The non-volatile semiconductor memory device according to claim 2, wherein said interconnecting means includes means for preventing a high voltage generated by said high voltage generating means from being transmitted to a corresponding main word line.

4. The non-volatile semiconductor memory device according to claim 3, wherein said preventing means includes an insulated gate type transistor having a threshold voltage, said insulated gate type transistor being interposed between the corresponding main word line and a corresponding auxiliary word line and having a gate electrode to receive a predetermined voltage.

5. The non-volatile semiconductor memory device according to claim 4, wherein said predetermined voltage is at a level corresponding to said operating source voltage.

6. The non-volatile semiconductor memory device according to claim 4, wherein said predetermined voltage is lower than said operating source voltage and higher than the threshold voltage of said insulated gate type transistor.

7. The non-volatile semiconductor memory device according to claim 4, wherein said interconnecting means further includes resistor means.

8. The non-volatile semiconductor memory device according to claim 3, wherein each said auxiliary word line includes one end and another end, and said interconnecting means further includes means responsive to a data read-out instruction signal to connect said main word line to the other end of each said auxiliary word line.

9. The non-volatile semiconductor memory device according to claim 1, wherein said plurality of auxiliary word lines are divided into two or more groups, each said group including a plurality of auxiliary word lines in such a manner that, when selected, simultaneous data communication is enabled between selected memory cells and all of said data transmission lines, and
    said interconnecting means including
    means responsive to the row selection signal and a group selection signal to transmit said row selection signal to the auxiliary word lines of the selected group.

10. A non-volatile semiconductor memory according to claim 1, wherein said interconnecting means comprises means for providing a selection signal from said word line to said auxiliary word line.

11. In a non-volatile semiconductor memory device having word lines for accessing a plurality of memory cells corresponding to a byte of stored data and a plurality of internal data communication lines corresponding at least in number to the number of bits n in one said byte of said stored data and error correction circuitry connected to said internal data communication lines and capable of correcting data containing an error rate of at least one bit per byte but less than n bits per byte of said stored data, the improvement comprising:
  a plurality of auxiliary word lines being provided such that at least one auxiliary word line is connected to select memory cells to be connected to a responsive internal data communication line,
  said auxiliary word lines being activated in response to signals appearing at least on a selected one of said word lines for accessing said byte of stored data from memory cells connected to a plurality of simultaneously activated auxiliary word lines, a memory cell of each said simultaneously activated auxiliary word line providing data to a respective internal data communication line different than those connected to memory cells on other said simultaneously activated auxiliary word lines,
  whereby an error caused by a circuit defect in one or more but less than n of said memory cells is inhibited from causing errors in other bits of said byte and can be corrected by said error correction circuitry.

12. In a non-volatile semiconductor memory as recited in claim 11, the improvement further comprising:
  each internal data communication line being associated with at least one of said plurality of said auxiliary word lines.

13. In a non-volatile semiconductor memory as recited in claim 12, the improvement further comprising:
  said non-volatile semiconductor memory being articulated in selectable blocks and
  said auxiliary word lines are selected by at least signals on said word lines and selection of at least one said block on said non-volatile semiconductor memory.

14. An isolation means for use in isolating circuit defects in a semiconductor memory having a plurality of memory cells corresponding to a byte of stored data, said plurality of memory cells being accessed by at least a signal on a word line of said memory, a plurality of internal data communication lines corresponding in number to the number of bit sin said byte of stored data and error correction means for correcting data on said internal data communication lines containing an error rate of at least one bit per byte, said isolation means comprising:
  a plurality of auxiliary word lines simultaneously selectable by at least a signal on said word line and corresponding in number to each bit of said byte of said stored data, a memory cell on each auxiliary word line providing a bit of data to a different internal data communication line when a plurality of said auxiliary word lines are simultaneously activated, and
  conduction means having a selectable conduction threshold connecting said word lines to said auxiliary word lines corresponding to respective bits of said byte of said stored data.

15. The non-volatile semiconductor memory device according to claim 14, further comprising high voltage generating means provided for each of said auxiliary word lines and adapted for raising the voltage on an associated auxiliary word line to a voltage higher than an operating source voltage.

16. The non-volatile semiconductor memory device according to claim 15, wherein said interconnecting means includes means for preventing the high voltage generated by said high voltage generating means from being transmitted to the corresponding main word line.

17. The non-volatile semiconductor memory device according to claim 16, wherein said preventing means includes an insulated gate type transistor having a threshold voltage, said insulated gate type transistor being interposed between the corresponding main word line and a corresponding auxiliary word line and having by a gate electrode connected to receive a predetermined voltage.

18. The non-volatile semiconductor memory device according to claim 17, wherein said predetermined voltage is at a level corresponding to said operating source voltage.

19. The non-volatile semiconductor memory device according to claim 17, wherein said predetermined voltage is lower than said operating source voltage and higher than the threshold voltage of said insulated gate type transistor.

20. The non-volatile semiconductor memory device according to claim 17, wherein said interconnecting means further includes resistor means.

21. The non-volatile semiconductor memory device according to claim 16, wherein each said auxiliary word line includes one end and another end, and said interconnecting means further includes means responsive to a data read-out instruction signal to connect said main word line to the other end of each said auxiliary word line.

22. The non-volatile semiconductor memory device according to claim 14, wherein said plurality of auxiliary word lines are divided into two or more groups, each said group including a plurality of auxiliary word lines in such a manner that, when selected, simultaneous data communication is enabled between selected memory cells and all of said data transmission lines, and
  said interconnecting means including
    means responsive to the row selection signal and a group selection signal to transmit said row selection signal to the auxiliary word lines of the selected group.

* * * * *